(12) United States Patent
Womac et al.

(10) Patent No.: US 7,640,001 B2
(45) Date of Patent: Dec. 29, 2009

(54) SYSTEM AND METHOD FOR PROVIDING DISTRIBUTED GAIN

(75) Inventors: Michael D. Womac, McKinney, TX (US); Armin G. Deiss, Richardson, TX (US); Thomas Leigh Davis, Carrollton, TX (US); Kim E. Beumer, Richardson, TX (US)

(73) Assignee: Microtune (Texas), L.P., Plano, TX (US)

( * ) Notice: Subject to any disclaimer, the term of this patent is extended or adjusted under 35 U.S.C. 154(b) by 587 days.

(21) Appl. No.: 11/316,301

(22) Filed: Dec. 20, 2005

(65) Prior Publication Data

US 2007/0142016 A1 Jun. 21, 2007

(51) Int. Cl.
*H04B 1/10* (2006.01)
*H04B 1/06* (2006.01)
(52) U.S. Cl. ............... 455/307; 455/232.1; 455/251.1
(58) Field of Classification Search .......... 455/136, 455/138, 219, 307, 309, 232.1, 240.1, 239.1, 455/241.1, 245, 247.1, 250.1, 251.1
See application file for complete search history.

(56) References Cited

U.S. PATENT DOCUMENTS

| | | | | |
|---|---|---|---|---|
| 5,929,706 A | * | 7/1999 | Haruta et al. | 330/279 |
| 6,975,848 B2 | * | 12/2005 | Rawlins et al. | 455/307 |
| 7,135,940 B2 | * | 11/2006 | Kawakubo et al. | 333/17.1 |
| 7,277,511 B2 | * | 10/2007 | Langlais et al. | 375/345 |
| 7,298,600 B2 | * | 11/2007 | Takikawa et al. | 361/56 |
| 2001/0006542 A1 | * | 7/2001 | Ozeki et al. | 375/345 |
| 2003/0128071 A1 | | 7/2003 | Nguyen et al. | 330/254 |
| 2003/0228852 A1 | | 12/2003 | Murakami et al. | 455/127.3 |
| 2004/0022004 A1 | | 2/2004 | Habuka et al. | 361/119 |
| 2004/0027200 A1 | | 2/2004 | Ashby et al. | 330/254 |

FOREIGN PATENT DOCUMENTS

WO WO 2004/047323 A1 6/2004

OTHER PUBLICATIONS

PCT Notification of Transmittal of the International Search Report and the Written Opinion of the International Searching Authority, or the Declaration in International Application No. PCT/US06/48742, dated Apr. 24, 2008, 9 pages.
European Patent Office; Extended European Search Report for Application No. 06847894.0-1233; 6 pages, Dec. 23, 2008.

* cited by examiner

*Primary Examiner*—Sonny Trinh
(74) *Attorney, Agent, or Firm*—Baker Botts L.L.P.

(57) ABSTRACT

A system for filtering a signal includes a plurality of filter modules coupled in series. Each filter module includes a filter and a variable gain element. Each filter is capable of receiving an input signal, attenuating a portion of the input signal that is outside a passband associated with the filter, and outputting at least a portion of the input signal that is within the passband associated with the filter. Each variable gain element is capable of receiving a control signal and inducing a gain in an output of the filter based on the control signal.

21 Claims, 7 Drawing Sheets

SYSTEM AND METHOD FOR PROVIDING DISTRIBUTED GAIN

TECHNICAL FIELD OF THE INVENTION

This invention relates in general to signal filters, and more particularly to a configuration of signal filters that provides distributed gain.

BACKGROUND OF THE INVENTION

Many radio-frequency (RF) communication systems transmit information within multiple frequency ranges, or "channels," of the RF spectrum simultaneously. As a result, a device attempting to receive and process information transmitted in a particular channel may need to isolate signals propagating at frequencies within the relevant channel for further processing and may discard signals propagating outside the relevant channel. Consequently, filtering is a common operation in multi-frequency communication systems.

In many applications, the isolated signal is also amplified to prepare the signal for further processing. Amplification may induce non-linearity in the isolated signals, particularly as the level of amplification is adjusted to accommodate input signals of varying strength. This non-linearity may, in turn, lead to deteriorated performance in the overall system.

SUMMARY OF THE INVENTION

In accordance with the present invention, the disadvantages and problems associated with filters have been substantially reduced or eliminated. In particular, a filter that provides improved linearity and increased control is disclosed.

In accordance with one embodiment of the present invention, a system for filtering a signal includes a plurality of filter modules coupled in series. Each filter module includes a filter and a variable gain element. Each filter is capable of receiving an input signal, attenuating a portion of the input signal that is outside a passband associated with the filter, and outputting at least a portion of the input signal that is within the passband associated with the filter. Each variable gain element is capable of receiving a control signal and inducing a gain in an output of the filter based on the control signal.

In accordance with another embodiment of the present invention, a method for filtering an input signal includes receiving an input signal at a first filter module in a plurality of filter modules coupled in series. Each filter module in the plurality includes a filter and a variable gain element. The method further includes attenuating, at a first filter in the first filter module, a portion of an input signal that is outside a passband associated with the first filter and inducing, at a first variable gain element in the first filter module, a first gain in an output of the first filter based on a first control signal received by the first variable gain element. Additionally, the method includes attenuating, at a second filter in a second filter module, a portion of a signal output by the first variable gain element that is outside a passband associated with the second filter and inducing, at a second variable gain element in the second filter module, a second variable gain in an output signal of the second filter.

Important technical advantages of certain embodiments of the present invention include greater control of the gain induced by baseband filters. Additional technical advantages of certain embodiments include lower current consumption by baseband filters, smoother transitions between gain levels, and an improvement in the linearity of the baseband filters.

Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
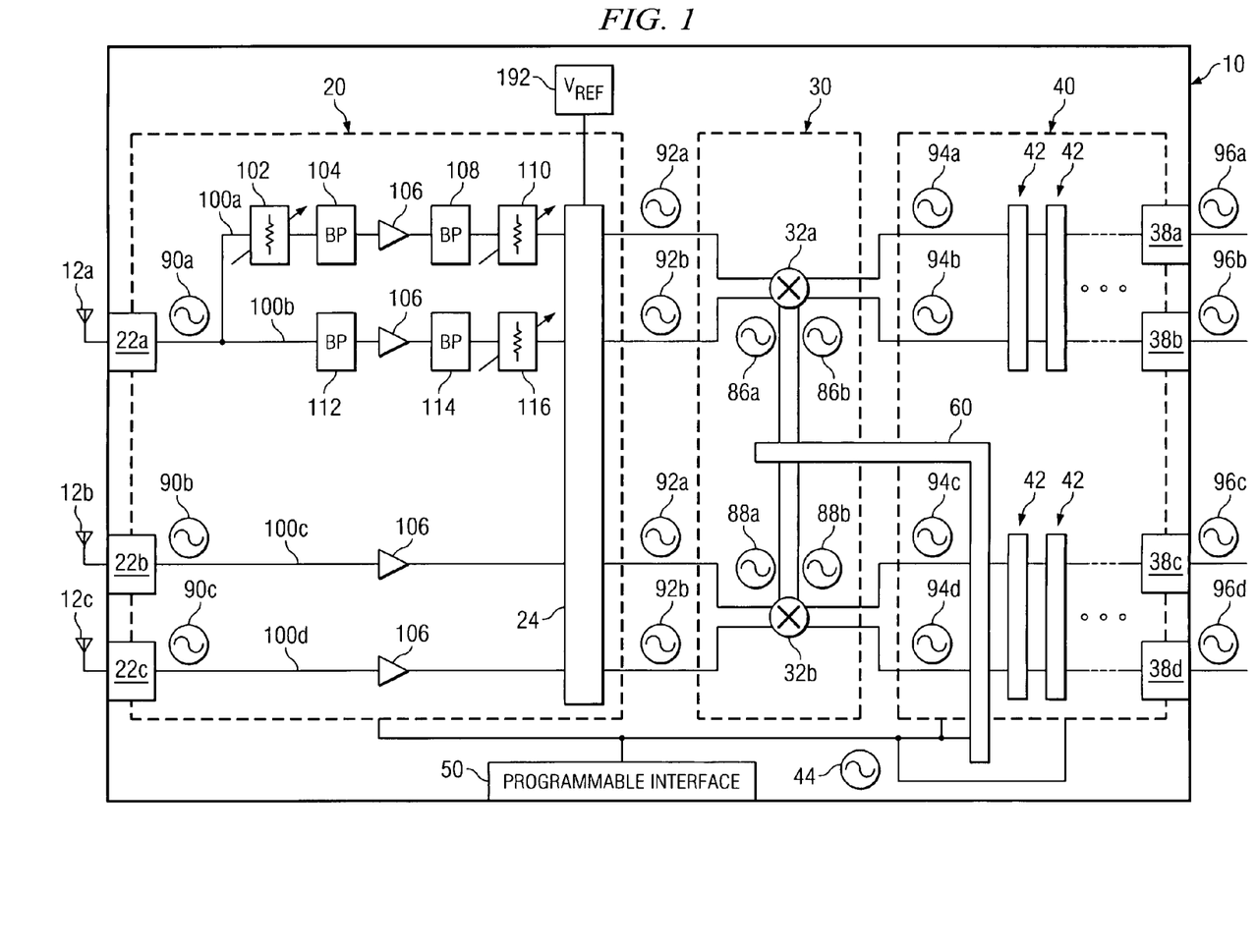
FIG. 1 illustrates a radio-frequency tuner.

FIG. 1 is a block diagram illustrating functional components of a particular embodiment of a tuner 10 capable of tuning radio-frequency signals received over particular portions of the radio-frequency spectrum. As shown in FIG. 1, tuner 10 includes a radio-frequency (RF) stage 20, a mixing stage 30, and a filter stage 40. RF stage 20 and mixing stage 30, respectively, select and downconvert input signals 90 received by tuner 10. Filter stage 40 may then isolate a particular channel within a selected input signal 90 and may also induce a variable gain in the downconverted signal. Although FIG. 1 illustrates, for purposes of example, a particular type of system that incorporates the described filter stage 40 for filtering particular types of signals, filter stage 40 may be incorporated into any suitable communication system for use with any appropriate input signals 90.

In particular embodiments, filter stage 40 may include a plurality of variable gain elements each operable to induce a gain in the downconverted signal. As a result, filter stage 40, as described in greater detail below, may be operable to provide greater control over both the gain induced in the tuned output and the linearity of the tuned output. Thus, filter stage 40 may provide multiple benefits to tuner 10 and/or other devices that incorporate filter stage 40.

RF stage 20 receives input signals 90 from input ports 22 and conditions input signals 90 to facilitate tuning of input signals 90 by mixing stage 30. RF stage 20 conditions input signals 90 in any appropriate manner based on the characteristics of the input signals 90 received by tuner 10 and the configuration of mixing stage 30. In the illustrated embodiment, RF stage 20 includes a plurality of input paths 100 connecting each of tuner input ports 22 to a signal converter 24. Nonetheless, RF stage 20 may include any appropriate number and configuration of components to perform the relevant signal-conditioning based on the input signals 90 received by tuner 10 and the characteristics and capabilities of the other components of tuner 10.

With respect to the contents of the illustrated example of RF stage 20, signal converter 24 couples one of input paths 100 to mixing stage 30 based on a frequency or channel selected by the user and/or other appropriate factors. Additionally, signal converter 24 may convert the input signals 90 received by RF stage 20 in an appropriate manner to facilitate the input of these signals to mixing stage 30. Signal converter 24 then outputs the input signal 90 from a selected input path 100 as one or more preprocessed signals 92. In particular embodiments, signal converter 24 converts single-ended, voltage-mode input signals 90 received by tuner 10 into a differential pair of current-mode preprocessed signals (92a and 92b). Furthermore, each of input paths 100 is operable to connect a particular tuner input port 22 to signal converter 24. As shown, input path 100a includes a first attenuator 102, a first tunable bandpass filter 104, a low noise amplifier 106, a second tunable bandpass filter 108, and a second attenuator 110 that are connected in series and that couple tuner input port 22a to signal converter 24. Second input path 100b includes a third tunable bandpass filter 112, a low noise amplifier 106, a fourth tunable bandpass filter 114, and a third attenuator 116 that are connected in series and that also couple tuner input port 22a to signal converter 24. Third input path 100c includes low noise amplifier 106 and couples tuner input port 22b to signal converter 24. Fourth input path 100d includes a low noise amplifier 106 and couples tuner input port 22c to signal converter 24.

In particular embodiments, multiple input paths 100 may connect the same tuner input port 22 to signal converter 24. In such embodiments, the multiple input paths 100 may each provide different forms of processing to the input signals 90 received by that tuner input port 22. For example, in the illustrated embodiment, both input paths 100a and 100b connect tuner input port 22a to signal converter 24. Based, in part, on the presence of the additional attenuator in first input path 100a, first input path 100a may be more tolerant of interference, while second input path 100b may allow for improved reception of weaker signals. Thus, depending on the strength of input signals 90 and/or other operational considerations, the user or tuner 10 itself may select or cause to be selected an appropriate one of input path 100a and 100b to provide input signals 90 from input port 22a to mixing stage 30.

Furthermore, in particular embodiments, tuner 10 may be housed in a single integrated circuit and signal converter 24 may be coupled to a single reference voltage 192 provided by components external to tuner 10 for converting input signals 90 received over multiple different bands of the radiofrequency spectrum. Reference voltage 192 may be provided by any appropriate component or collection of components. In particular embodiments, reference voltage 192 is provided by a charged capacitor, a reference generator, and/or any other appropriate components suitable to provide a voltage having the desired electronic characteristics.

Mixing stage 30 receives preprocessed signal 92 from RF stage 20 and downconverts preprocessed signal 92 based on a selected tuning frequency. In the illustrated embodiment, mixing stage 30 includes a pair of mixers 32. More specifically, in the illustrated embodiment mixing stage 30 represents a quadrature mixing stage 30 that includes an in-phase mixer 32a and a quadrature mixer 32b. Mixers 32 mix preprocessed signals 92 output by RF stage 20 with tuning signals generated by frequency generation circuit 60 to produce a downconverted version of a particular input signal 90 received by tuner 10. Mixing stage 30 may include any appropriate combination of software and/or hardware suitable to provide the described functionality.

Frequency generation circuit 60 generates tuning signal 86, a periodic signal generated at a particular frequency that is determined based on the frequency of the signal to be downconverted by mixing stage 30. In the illustrated embodiment, frequency generation circuit 60 generates tuning signal 86 as a differential signal pair (86a and 86b). In particular embodiments, frequency generation circuit 60 also generates a phase-shifted tuning signal 88 for use by quadrature mixer 32b. In the illustrated embodiment, frequency generation circuit 60 generates phase-shifted tuning signal 88 as a differential signal pair (88a and 88b). Frequency generation circuit 60 may include oscillators, frequency dividers, phase-shifting elements, and/or any other appropriate components suitable to generate the described tuning signals.

Filter stage 40 isolates a portion of downconverted signal 94 that is within one or more passbands associated with filter stage 40 and outputs one or more output signals 96 that include the isolated portion of downconverted signal 94. Additionally, in particular embodiments, filter stage 40 may include a plurality of filter modules 42, each capable of inducing a variable gain in downconverted signals 94 that may be adjusted based on control signals 44 received from programmable interface 50. The contents and operation of a particular embodiment of filter stage 40 are described in greater detail below with respect to FIG. 2.

Programmable interface 50 allows other components coupled to tuner 10 to control the operation of tuner 10. In particular embodiments, programmable interface 50 represents a serial digital bus and control logic capable of adjusting operation of various components of tuner 10 based on control information transmitted on the serial digital bus. In general, however, programmable interface 50 may include any appropriate collection of hardware and/or software to allow tuner 10 to receive control information from the user or other elements of tuner 10. In particular embodiments, programmable interface 50 may be configured to communicate with a user of tuner 10 through a user interface (not shown). Programmable interface 50 may also be configured to provide control signals 44 to any or all of the elements of RF stage 20 and filter stage 40, and these control signals 44 may be propagated between and within the two stages in any appropriate manner. As one specific example, programmable interface 50 may transmit control signals 44 to filter stage 40. Filter stage 40 may then use control signals 44 to configure variable gain elements included in filter stage 40, as described in greater detail below with respect to FIGS. 2-4.

In operation, RF stage 20 receives input signals 90 at input ports 22. RF stage 20 may receive input signals 90 from any appropriate sources. In particular embodiments, RF stage 20 may couple to a plurality of antennas 12 through input ports 22, and input signals 90 may represent signals received by these antennas 12 and transmitted to input ports 22. After being received at input ports 22, input signals 90 propagate over input paths 100 to signal converter 24.

Signal converter 24 selects a particular input path 100 to output. In particular embodiments, signal converter 24 selects the input path 100 based on control signals 44 received from programmable interface 50. Depending on the configuration of tuner 10, signal converter 24 may, by selecting a particular input path 100 to output, select the source from which tuner 10 receives the input signal. For example, in the illustrated embodiment, signal converter 24 may, by selecting between input paths 100b-d, select between input signals 90 received at input ports 22a-c respectively. Additionally, in particular embodiments, multiple input paths 100 may couple a particular input port 22 to signal converter 24. In such embodiments, signal converter 24 may also, by selecting a particular input path 100, select the conditioning to be performed to the selected input signal 90. For example, in the illustrated embodiment, both input paths 100a and 100b couple input port 22a to signal converter 24 but, as a result of the different components included in input paths 100a and 100b, the two input paths 100 condition input signals 90 received at input port 22a in different manners. As a result, tuner 10 may be reconfigured dynamically to adjust to changes in operating conditions or performance requirements.

In addition to selecting a particular input path 100 to couple to mixing stage 30, signal converter 24 may also, in particular embodiments, convert the selected input signal 90 from a single-ended signal to a differential signal pair and/or from a voltage-mode signal to a current-mode signal. By amplifying input signals 90 prior to voltage-to-current conversion, particular embodiments of RF stage 20 may limit the current consumption by tuner 10. Moreover, by amplifying input signals 90, prior to converting them from single-ended signals to differential signal pairs, particular embodiments of RF stage 20 may produce improved noise figures. Additionally, by converting input signals 90 to differential signals before transmitting input signals 90 to mixing stage 30, tuner 10 may achieve better even-order distortion performance.

After any appropriate selection, conversion, and/or amplification, signal converter 24 outputs the selected input signal 90 to mixing stage 30 as preprocessed signal 92. In particular embodiments, signal converter outputs two copies of preprocessed signals 92, one copy for use by each of mixers 32. In the illustrated embodiment, each copy of preprocessed signal 92 represents a current-mode, differential signal pair (92a and 92b).

Mixers 32a and 32b of mixing stage 30 each receive a copy of preprocessed signal 92. Frequency generation circuit 60 provides mixers 32a and 32b with a tuning signal 86 and a phase-shifted version of tuning signal 86, referred to as phase-shifted tuning signal 88, both having a frequency equal to the selected tuning frequency. Based on tuning signal 86 and phase-shifted tuning signal 88, respectively, mixers 32a and 32b downconvert a particular frequency component or channel within preprocessed signal 92 to shift the relevant frequency or channel to a lower center frequency. More specifically, mixers 32a and 32b downconvert the relevant frequency component or channel so that the relevant frequency component or channel is centered at the desired baseband frequency. In particular embodiments, this frequency may be substantially near 1 Hz. After downconversion, preprocessed signals 92 are output by mixers 32a and 32b as downconverted signals 94. More specifically, in the illustrated embodiment, mixers 32a and 32b output an in-phase downconverted signal pair 94a and 94b and a quadrature downconverted signal pair 94c and 94d.

Filter stage 40 receives downconverted signals 94 from mixing stage 30. After receiving downconverted signals 94, filter stage 40 isolates components of downconverted signals 94 within one or more passbands associated with filter stage 30. Filter stage 40 may additionally induce a gain in downconverted signals 94 to facilitate the use of tuner's output by other components coupled to tuner 10. In particular, filter stage 40 may include a plurality of filtering elements arranged in series, each capable of independently inducing a gain in preprocessed signals 94. The operation of filter stage 40 is described in greater detail below with respect to FIGS. 2-4.

Filter stage 40 then outputs information from the selected channel at one or more output ports 38 as output signals 96. In the illustrated embodiment, output signals 96 represent a pair of quadrature, differential signals output by tuner 10 at output ports 38a-d. In particular embodiments, other suitable components couple to output ports 38 and process output signals 96. For example, in particular embodiments, a demodulator couples to tuner 10 at output ports 38 and demodulates output signals 96 for display to a user of a video device that includes tuner 10.

Thus, tuner 10 tunes input signals 90 and outputs information from a particular selected channel within input signals 90. As part of this process, filter stage 40 isolates portions of downconverted signals 94 and induces gain in downconverted signals 94 using a plurality of gain-inducing elements. By incorporating multiple gain-inducing elements distributed between multiple filters, filter stage 40 may be capable of providing finer control of the gain induced by filter stage 40, as described in greater detail below. Additionally, the distribution of gain-inducing elements throughout filter stage 40 may allow filter stage 40 to support techniques for increasing and/or decreasing the gain induced by filter stage 40 without inducing non-linearity in output signals 96. As a result, filter stage 40 may provide multiple operational benefits when utilized in tuner 10 or other suitable devices. Nonetheless, various embodiments of filter stage 40 and/or components incorporating filter stage 40 may exhibit some, none, or all of these benefits.

Figure 2:
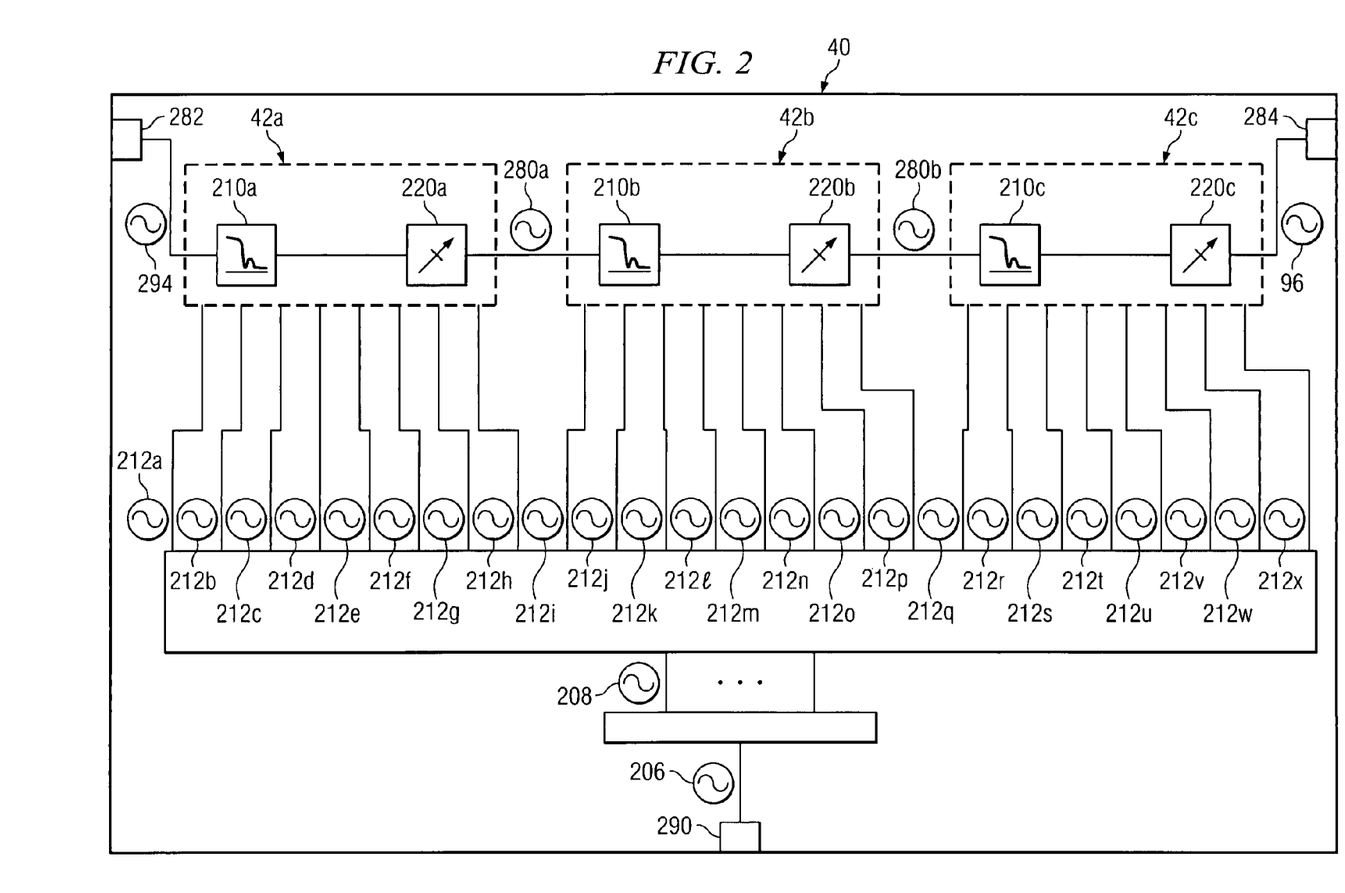
FIG. 2 illustrates a filter stage that may be included in a particular embodiment of the tuner shown in FIG. 1.

FIG. 2 is a block diagram illustrating the contents of filter stage 40 according to a particular embodiment. Filter stage 40 includes a plurality of filter modules 42, an analog-to-digital (A/D) converter 202, and a gain control unit 204. Moreover, each filter module 42a, 42b, and 42c includes a lowpass filter 210 and a variable gain element 220. Although FIG. 2 illustrates an embodiment of filter stage 40 that includes particular elements configured in a particular manner, filter stage 40 may include any appropriate components arranged and operated in any manner suitable to provide the described functionality. For example, although FIG. 2 illustrates an embodiment in which filter stage 40 utilizes a particular collection of control signals to control operation of its various components, including at various stages analog and digital control signals, filter stage 40 may utilize any appropriate form of control signals.

Lowpass filters 210 attenuate and/or filter out frequency components of downconverted signals 94 that are outside one or more passbands associated with lowpass filters 210. In particular embodiments, lowpass filters 210 represent baseband filters capable of isolating a baseband component of downconverted signals 94 received by filter stage 40. Lowpass filters 210 may include any appropriate collection of hardware and/or software suitable to provide the described functionality and each of lowpass filters 210a-c may include identical or differing components from any other of lowpass filters 210a-c.

Variable gain elements 220 each induce a variable gain or attenuation in signals received by variable gain elements 220. In particular embodiments, variable gain elements 220 receive decoded control bits 212 from gain control unit 204 and determine the magnitude of the gain they induce based on decoded control bits 212. Variable gain elements 220 may include any appropriate collection of hardware and/or software suitable to provide the described functionality and each of variable gain elements 220 may include identical or differing components from any other of variable gain elements 220.

The contents and operation of a particular embodiment of a variable gain element 220 is described below with respect to FIG. 3.

A/D converter 202 converts an analog control signal 206 received from programmable user interface 50 into one or more digital control signals 208. A/D converter 202 then transmits the digital control signals 208 to gain control unit 204. A/D converter 202 may include any appropriate collection of hardware and/or software suitable to provide the described functionality. As noted above, although FIG. 2 illustrates a particular embodiment of filter stage 40 that receives, generates, and/or utilizes control signals of a particular form and number, alternative embodiments of filter stage 40 may be configured to receive, generate, and/or use any appropriate form and number of control signals.

Gain control unit 204 receives digital control signals 208 from A/D converter 202 and independently controls the operation of each variable gain element 220. Gain control unit 204 may represent any suitable software and/or hardware appropriate to provide the described functionality. As one specific example, in particular embodiments, gain control unit 204 may represent a decoder that receives one or more digital control signals 208 from A/D converter 202 and generates, based on the control signal, one or more decoded control bits 212 for each variable gain element 220.

In operation, filter stage 40 receives an analog control signal 206 from programmable interface 50 at a control signal port 290. In particular embodiments, A/D converter 202 receives analog control signal 206 from control signal port 290 and converts analog control signal 206 to a digital signal 208. A/D converter 202 then transmits digital control signal 208 to gain control unit 204. In the illustrated embodiment, digital control signal 208 represents an eight-bit digital signal. Nonetheless, digital control signal 208 may represent any appropriate number of signals and/or bits.

Filter stage 40 receives one or more downconverted signal 94 at one or more filter input ports 282, shown in FIG. 2 as downconverted signal 294. Downconverted signal 294 then propagates to a first filter module 42 in the series of filter modules 42 included in filter stage 40, specifically filter module 42a. Lowpass filter 210a of filter module 42a attenuates and/or filters out high-frequency components of downconverted signal 294. The output of lowpass filter 210a is transmitted to variable gain element 220a of filter module 42a.

Variable gain element 220a induces a gain or attenuation in downconverted signal 294. More specifically, in particular embodiments, variable gain element 220a receives a plurality of decoded control bits 212, decoded control bits 212a-d, from gain control unit 204. Variable gain element 220a induces a gain in downconverted signal 294 based on decoded control bits 212a-x received from gain control unit 204. Although FIG. 2 illustrates an embodiment of filter stage 40 in which gain control unit 204 transmits eight decoded control bits 212 to each variable gain element 220, alternative embodiments of filter stage 40 may be configured to transmit any appropriate number and form of control signals to each variable gain element 220.

Filter module 42a transmits the output of variable gain element 220a (shown in FIG. 2 as filtered signal 260a) to filter module 42b. Lowpass filter 210b of filter module 42b attenuates and/or filters out high-frequency components of filtered signal 260a with respect to the desired low-frequency components of filtered signal 260a. The output of lowpass filter 210b is transmitted to variable gain element 220b of filter module 42b. Variable gain element 220b induces a gain in filtered signal 260a. More specifically, in particular embodiments, variable gain element 220b receives a plurality of decoded control bits 212, decoded control bits 212i-p, from gain control unit 204. Variable gain element 220b induces a gain in filtered signal 260a based on decoded control bits 212i-p received from gain control unit 204.

Filter module 42b transmits the output of variable gain element 220b (shown in FIG. 2 as filtered signal 260b) to filter module 42c. Lowpass filter 210c of filter module 42c attenuates and/or filters out high-frequency components of filtered signal 260b. The output of lowpass filter 210c is transmitted to variable gain element 220c of filter module 42c. Variable gain element 220c induces a gain in filtered signal 260b. More specifically, in particular embodiments, variable gain element 220c receives a plurality of decoded control bits 212, decoded control bits 212q-x, from gain control unit 204. Variable gain element 220c induces a gain in filtered signal 260b based on decoded control bits 212q-x received from gain control unit 204. Filter module 42c transmits the output of variable gain element 220c (output signal 96) to filter output port 284.

During operation, a user, or another device coupled to tuner 10, may adjust the analog control signal 206 received by filter stage 40 through programmable interface 50. As analog control signal 206 changes, digital control signal 208 output by A/D converter 202 also changes. Additionally, one or more decoded control bits 212 transmitted by gain control unit 204 changes as a result of such variations in digital control signal 208.

For example, in particular embodiments, filter stage 40 receives an analog control signal 206 that has a voltage that indicates an overall gain to be induced by filter stage 40. As analog control signal 206 increases and, as a result, digital control signal 208 increases, gain control unit 204 adjusts decoded control bits 212a-x transmitted to the individual variable gain elements 220. In particular, gain control unit 204 reduces or increases the overall gain by first adjusting the gain induced by variable gain element 220c, then adjusting the gain induced by variable gain element 220b if needed, and finally adjusting the gain induced by variable gain element 220a if needed. By adjusting the overall gain in this manner, filter module 40 may reduce the non-linearity induced in output signal 96 when changes are implemented in the overall gain induced by filter module 40. FIGS. 4-5 and 6-7, respectively, describe in greater detail example techniques for increasing and decreasing the overall gain induced by filter module 40.

Figure 3:
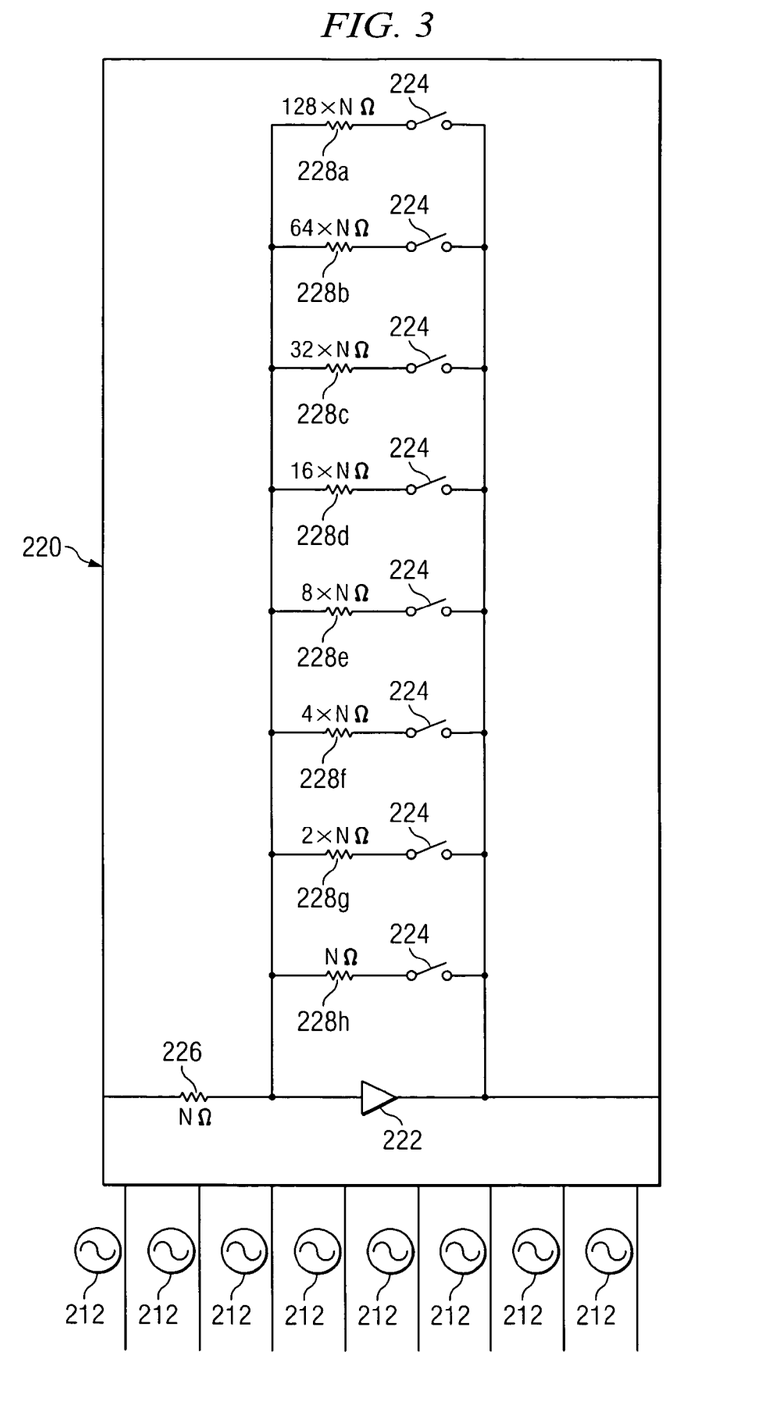
FIG. 3 illustrates a particular embodiment of a variable gain element that may be utilized in the filter stage shown in FIG. 2.

FIG. 3 illustrates the contents and operation of a particular embodiment of an example variable gain element 220 that may be used in the embodiment of filter module 40 shown in FIG. 2. As shown in FIG. 3, variable gain element 220 includes an operational amplifier ("op-amp") 222, a plurality of switches 224, an input resistor 226, and a plurality of feedback resistors 228. Although shown, for the purposes of simplicity, as receiving a single-ended signal, variable gain element 220 in particular embodiments may, with appropriate modifications, be configured to receive and amplify differential signals instead. Additionally, although input resistor 226 and feedback resistors 228 are described below as "resistors," for the purposes of this description, any resistor may represent a conventional resistor, an appropriately-configured transistor, and/or any other suitable form of resistive element.

In operation, the illustrated embodiment of variable gain element 220 receives control bits 212 from gain control unit 204. Using control bits 212, gain control unit 204 opens and closes switches 224 to configure variable gain element 220 to induce a particular gain in signals received by variable gain element 220. More specifically, because the gain induced by op-amp 222 depends on the resistance present in both the input path and the feedback path of op-amp 222, gain control unit 204 can configure variable gain element 220 to provide various levels of gain by switching a particular feedback resistor 228, or a particular combination of feedback resistors 228, into the feedback path of op-amp 222. In particular embodiments, variable gain elements 220 may each include a binary-weighted collection of feedback resistors 228. An example of this is shown in the variable gain element 220 illustrated in FIG. 3.

More specifically, as shown, variable gain element 220 includes an input resistor 226 having a resistance of N ohms, where N may represent any appropriate value. The illustrated variable gain element 220 also includes feedback resistors 228a-h, each having a resistance that may range from N ohms to 128×N ohms, and switches 224a-h, each operable to couple an associated one of feedback resistors 228a-h into the feedback path of op-amp 222. By switching one, or a particular combination, of these feedback resistors 228 into the feedback path of op-amp 222, gain control unit 204 can select any of a variety of different values for the gain of variable gain element 220.

Figure 4:
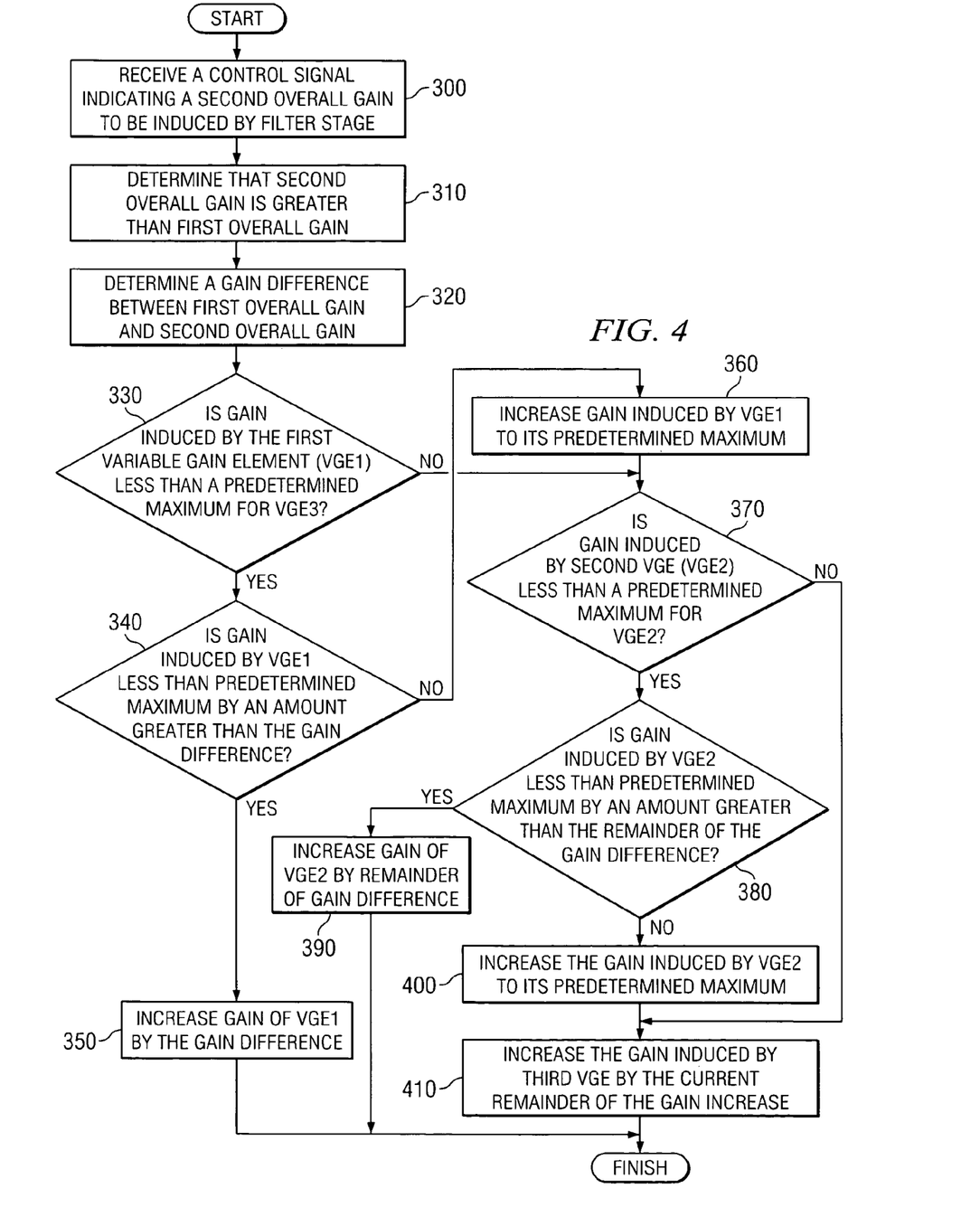
FIG. 4 is a flowchart illustrating operation of a particular embodiment of the filter stage shown in FIG. 2 as the filter stage increases the gain induced in a received signal.

FIG. 4 is a flowchart illustrating an example of the operation of a particular embodiment of filter stage 40 in determining that an increase in the overall gain induced by filter stage 40 is appropriate and increasing the overall gain. While FIG. 4 illustrates operation of a particular embodiment of filter stage 40 that includes three variable gain elements 220, the described techniques may be modified in an appropriate manner to be utilized in devices that include any suitable number of variable gain elements 220. Furthermore, any or all of the steps illustrated in FIG. 4 may be combined, modified, or deleted where appropriate, and additional steps may also be added to the described process. Additionally, the illustrated steps may be performed in any suitable order without departing from the scope of the invention.

Figure 6:
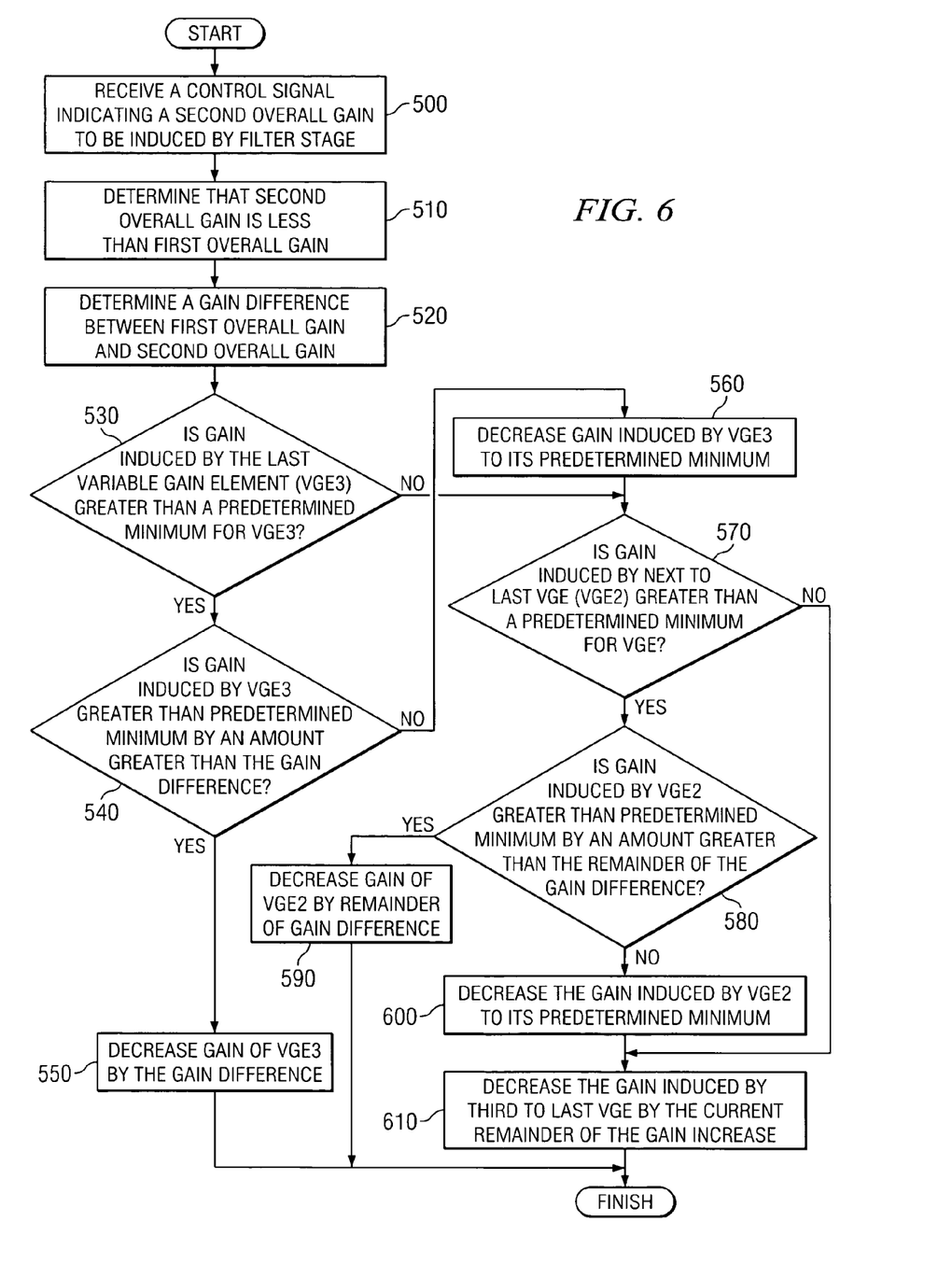
FIG. 6 is a flowchart illustrating operation of a particular embodiment of the filter stage shown in FIG. 2 as the filter stage decreases the gain induced in a received signal.

Furthermore, although FIGS. 4 and 6 describe, for purposes of illustration, particular embodiments of filter stage 40 in which certain decisions and/or determinations are made by filter stage 40, alternative embodiments of filter stage 40 may instead allow other devices to perform such decision-making and may receive control information from these devices based on such decision-making. Furthermore, particular embodiments of filter stage 40 may be configured to provide the described functionality based on other appropriate decision-making and/or determinations. For example, the description below includes a step 320 in which filter stage. 40 determines whether the gain associated with variable gain element 220c is not less than a maximum gain associated with variable gain element 220c. Alternative embodiments of filter stage 40 may, instead of determining the relevant gain and/or comparing it to a predetermined maximum value, attempt to increase the relevant gain and then respond accordingly if unable to do so.

Returning now to the illustrated example, when operation begins, filter module 40 is assumed to have received or to be receiving a control signal (for example, by receiving an analog control signal 206 having a first magnitude) that indicates a first overall gain to be induced by filter stage 40. At step 300, filter module 40 receives a new control signal (for example, by receiving an analog control signal 206 having a second magnitude), indicating a second overall gain to be induced by filter stage 40. In the example illustrated by FIG. 4, the second overall gain is assumed to be greater than the first overall gain. At step 310, filter stage 40 determines that first overall gain is greater than the second overall gain. At step 320, filter stage 40 determines a gain difference between the first overall gain and the second overall gain.

Filter stage 40 then adjusts the gain induced by the variable gain elements of filter stage 40 to implement this change in the overall gain. As part of implementing the change, filter stage 40, at step 330, determines whether the gain currently being induced by the first variable gain element 220 along the path traversed by preprocessed signals 92, in this case variable gain element 220a, is less than a predetermined maximum gain associated with that variable gain element 220. If filter stage 40 determines that the gain currently being induced by variable gain element 220a is not less than the predetermined maximum gain associated with variable gain element 220a, operation continues at step 370.

If, instead, filter stage 40 determines that the gain currently being induced by variable gain element 220a is less than the predetermined maximum gain associated with variable gain element 220a, filter stage 40 determines whether filter stage 40 can increase the gain induced by variable gain element 220a enough to produce the entirety of the requested increase. As part of this determination, filter stage 40 may determine, at step 340, whether the gain currently being induced by variable gain element 220a is less than the predetermined maximum gain associated with variable gain element 220a by an amount greater than the gain difference. If so, filter module 42 increases the gain induced by variable gain element 220a by the gain difference at step 350. As shown in FIG. 4, this may conclude the operation of filter module 40 in executing the requested increase in the overall gain.

If, instead, filter module 40 determines at step 340 that filter module 40 cannot increase the gain associated with variable gain element 220a enough to produce the entirety of the requested increase in overall gain, filter stage 40 increases the gain induced by variable gain element 220a to the maximum gain associated with variable gain element 220a at step 360. Filter module 40 then determines whether the second variable gain element 220 along the path traversed by preprocessed signals 92, in this case variable gain element 220b, is currently inducing a gain less than a predetermined maximum gain associated with variable gain element 220b. If filter stage 40 determines that the gain currently being induced by variable gain element 220b is not less than the predetermined maximum gain associated with variable gain element 220b, operation continues at step 410.

If, instead, filter stage 40 determines that the gain currently being induced by variable gain element 220b is less than the predetermined maximum gain associated with variable gain element 220b, filter stage 40 determines, at step 380, whether filter stage 40 can increase the gain induced by variable gain element 220b enough to produce the remainder of the gain difference, that is any portion of the requested gain increase not achieved by any changes made to the gain induced by variable gain element 220a during any previously-executed steps, such as step 360. As part of this determination, filter stage 40 may determine, at step 380, whether the gain currently being induced by variable gain element 220b is less than the predetermined maximum gain associated with variable gain element 220b by an amount greater than the remainder of the gain difference. If so, filter module 42 increases the gain induced by variable gain element 220b by the remainder of the gain difference at step 390. As shown in FIG. 4, this may conclude the operation of filter module 40 in executing the requested increase in the overall gain.

If, instead, filter stage 40 determines at step 380 that filter module 40 cannot increase the gain associated with variable gain element 220b enough to produce the remainder of the gain difference, filter stage 40, at step 400, increases the gain induced by variable gain element 220b to the maximum gain associated with variable gain element 220b. Filter module 40 may then complete the requested increase by increasing the gain induced by the next variable gain element 220 along the path traversed by preprocessed signals 92, in this case variable gain element 220c, by an amount equal to the current remainder of the gain increase at step 410. At this point, the current remainder represents any portion of the requested gain increase not achieved by any changes made to the gain induced by variable gain elements 220a and 200b during any previously-executed steps, such as steps 360 and 400. As shown in FIG. 4, this may conclude the operation of filter module 40 in executing the requested increase in the overall gain.

Thus, filter module 40 may be capable of increasing the overall gain induced by filter module 40 by independently increasing the gain induced by individual variable gain elements 220. This may provide tuner 10 with greater and/or finer control over the magnitude of signals output by filter module 40. Additionally, filter module 40 may be configured to achieve such changes by incrementally increasing the gain induced by the various variable gain elements 220, advancing along the path over which preprocessed signals 92 propagate in traversing filter module 40. In particular embodiments, if filter module 40 completes the increase in this manner, filter module 40 may reduce or eliminate the non-linear contribution of filter module 96 in output signals 96. Consequently, particular embodiments of filter module 40 may provide multiple operational benefits.

Figure 5A:
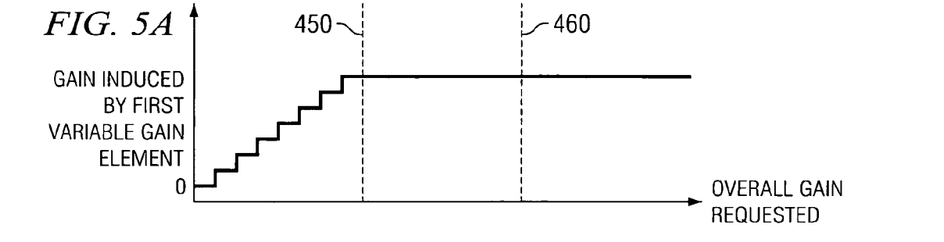
FIGS. 5A-5D are diagrams illustrating examples of the operation of a plurality of filter modules incorporated in a particular embodiment of the filter stage shown in FIG. 2 as the filter stage increases the gain induced in a received signal.
Figure 5B:
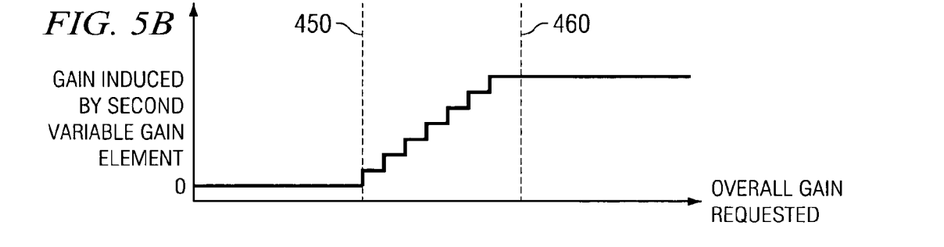
Figure 5C:
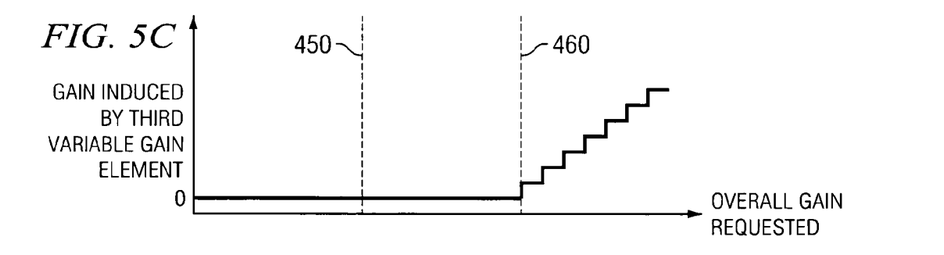
Figure 5D:
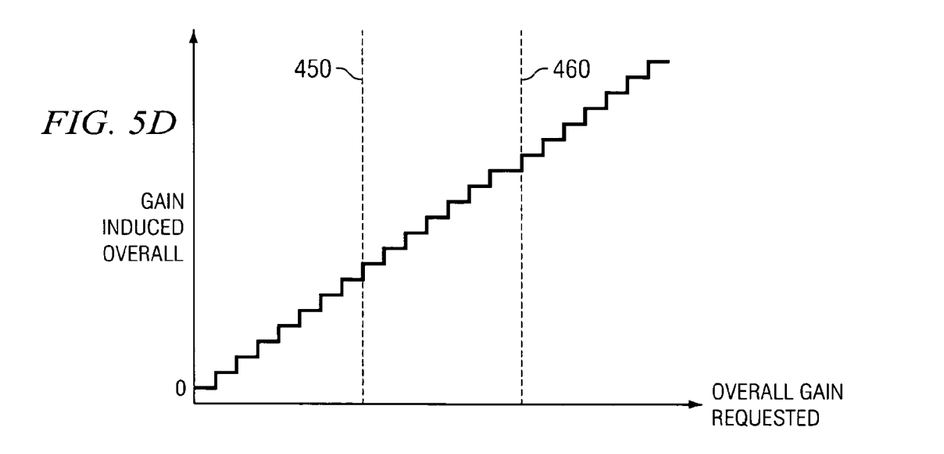

FIGS. 5A-5D are diagrams illustrating examples of the operation of a plurality of filter modules incorporated in a particular embodiment of the filter stage as the filter stage increases the gain induced in a received signal. As noted above, filter stage 40 includes any appropriate number of variable gain elements 220 that may be controlled using any number of appropriate decoded control bits 212. The embodiment of filter stage 40 described by FIGS. 5A-5D includes three variable gain elements 220, each receiving three decoded control bits 212. As a result, each variable gain element 220 is capable of inducing any of eight different levels of gain in signals received by variable gain elements 220. In particular, FIGS. 5A, 5B, and 5C illustrate the gain induced by variable gain elements 220a, 220b, and 220c, respectively, while FIG. 5D illustrates the overall gain induced by filter module 40. More specifically, FIGS. 5A-5D illustrate the gain induced by the relevant component as the overall gain induced by filter module 40 increases.

As shown by FIGS. 5A-5C, filter module 40 increases its overall gain by first increasing the gain induced by variable gain element 220a. Once variable gain element 220a is configured so that variable gain element 220a induces a gain equal to a maximum gain associated with variable gain element 220a (a point marked in FIGS. 5A-5D by line 450) filter module 40 continues to increase the overall gain by increasing the gain induced by variable gain element 220b. Once variable gain element 220b is configured so that variable gain element 220b induces a gain equal to a maximum gain associated with variable gain element 220b (a point marked in FIGS. 5A-5D by line 460) filter module 40 continues to increase the overall gain by increasing the gain induced by variable gain element 220c. Thus, filter module 40 is able to increase the overall gain induced by filer module 40 by gradually increasing the gain induced by the various variable gain elements 220 of filter module 40, starting with the first variable gain element 220 in the signal path traversed by received signals.

FIG. 6 is a flowchart illustrating an example operation of a particular embodiment of filter stage 40 in determining that a reduction in the overall gain induced by filter stage 40 is appropriate and reducing the overall gain. Although FIG. 6 illustrates operation of filter stage 40 in a particular embodiment of filter stage 40 that includes three variable gain elements 220, the described techniques may be modified in an appropriate manner to be utilized in devices that include any suitable number of variable gain elements 220. Furthermore, any or all of the steps illustrated in FIG. 6 may be combined, modified, reordered, or deleted where appropriate, and additional steps may also be added to the described process. Additionally, although particular embodiments of filter stage 40 may be capable of both decreasing the overall gain induced by filter stage 40 as shown in FIG. 4 and decreasing the overall gain as shown in FIG. 5, the described techniques may be used separately and particular embodiments may be capable of only performing one of the described increasing and decreasing techniques.

When the illustrated example operation begins, filter module 40 is assumed to have received or to be receiving a control signal that indicates a first overall gain to be induced by filter stage 40. At step 500, filter module 40 receives a new control signal indicating a second overall gain to be induced by filter stage 40. In the example illustrated by FIG. 5, the second overall gain is less than the first overall gain. As a result, at step 510 filter stage 40 determines that the second overall gain is less than the first overall gain. At step 520, filter stage 40 determines a gain difference between the second overall gain and the first overall gain.

Filter stage 40 then adjusts the gain induced by the variable gain elements of filter stage 40 to implement this change in the overall gain. As part of implementing the change filter stage 40, at step 530, determines whether the gain currently being induced by the last variable gain element 220 along the path traversed by preprocessed signals 92, in this case variable gain element 220c, is greater than a predetermined minimum gain associated with that variable gain element 220. In the illustrated example, the predetermined minimum gain associated with each of variable gain elements 220a-c is assumed to be 0 decibels (dB). Nonetheless, particular embodiments of filter stage 40 may include variable gain elements with any appropriate predetermined minimum gains. If filter stage 40, in the described embodiment, determines that the gain currently being induced by variable gain element 220c is equal to 0 dB, operation continues at step 570.

If, instead, filter stage 40 determines that the gain currently being induced by variable gain element 220c is greater than the minimum, filter stage 40 determines whether filter stage 40 can decrease the gain induced by variable gain element 220c enough to produce the entirety of the requested decrease. As part of this determination, filter stage 40 may determine, at step 540, whether the gain currently being induced by variable gain element 220c is greater than its minimum by an amount greater than the gain difference. If so, filter module 42 decreases the gain induced by variable gain element 220c by the gain difference at step 550. As shown in FIG. 5, this may conclude the operation of filter module 40 in executing the requested decrease in the overall gain.

If, instead, filter module 40 determines at step 540 that the gain currently induced by variable gain element 220c is not sufficiently large to allow filter module 40 to produce the requested decrease solely by decreasing the gain of variable gain element 220c, filter module 40 reduces the gain induced by variable gain element 220c to its minimum, in this case 0 db, at step 560. Filter module 40 then determines, at step 570, whether the next to last variable gain element 220 along the path traversed by preprocessed signals 92, in this case variable gain element 220b, is currently inducing a non-zero gain.

If filter stage 40 determines that variable gain element 220b is currently inducing zero gain, operation continues at step 610.

If, instead, filter stage 40 determines that variable gain element 220b is currently inducing a non-zero gain, filter stage 40 determines whether filter stage 40 can decrease the gain induced by variable gain element 220b enough to produce the remainder of the gain difference, that is any portion of the requested gain decrease not achieved by any changes made to the gain induced by variable gain element 220c during any previously-executed steps, such as step 560. As part of this determination, filter stage 40 may determine, at step 580, whether variable gain element 220b is currently inducing a gain greater than the remainder of the gain difference. If so, filter module 42 decreases the gain induced by variable gain element 220b by the remainder of the gain difference at step 590. As shown in FIG. 5, this may conclude the operation of filter module 40 in executing the requested decrease in the overall gain.

If, instead, filter stage 40 determines at step 580 that the gain currently being induced by variable gain element 220b is not sufficiently large to allow filter module 40 to produce the requested decrease solely by decreasing the gain of variable gain element 220b, filter stage 40, at step 600, decreases the gain induced by variable gain element 220b to its minimum, and operation then continues at step 610. Filter module 40 may then complete the requested decrease by decreasing the gain induced by the previous variable gain element 220 on the path traversed by preprocessed signals 92, in this case variable gain element 220a, by an amount equal to the current remainder of the gain decrease at step 610. At this point, the current remainder represents any portion of the requested gain decrease not achieved by any changes made to the gain induced by variable gain elements 220c and 220b during any previously-executed steps, such as steps 450 and 490. As shown in FIG. 5, this may conclude the operation of filter module 40 in executing the requested decrease in the overall gain.

Thus, similar to increasing the overall gain, filter module 40 may be capable of decreasing the overall gain by independently decreasing the gain induced by individual variable gain elements 220. This may likewise provide tuner 10 with greater and/or finer control over the magnitude of signals output by filter module 40. Additionally, filter module 40 may also be configured to achieve such changes by incrementally decreasing the gain induced by the various variable gain elements 220, working backwards along the path over which preprocessed signals 92 propagate in traversing filter module 40. In particular embodiments, if filter module 40 reduces the overall gain in this manner, filter module 40 may reduce or eliminate the non-linear contribution of filter module 96 in output signals 96. Consequently, particular embodiments of filter module 40 may provide multiple operational benefits.

Figure 7A:
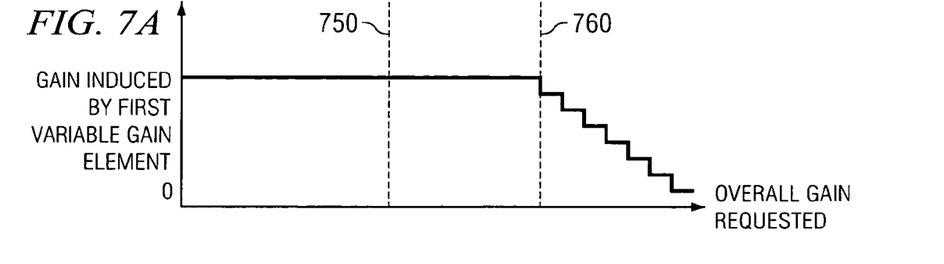
FIG. 7A-7D are diagrams illustrating examples of the operation of the plurality of filter modules incorporated in a particular embodiment of the filter stage shown in FIG. 2 as the filter stage decreases the gain induced in a received signal.
Figure 7B:
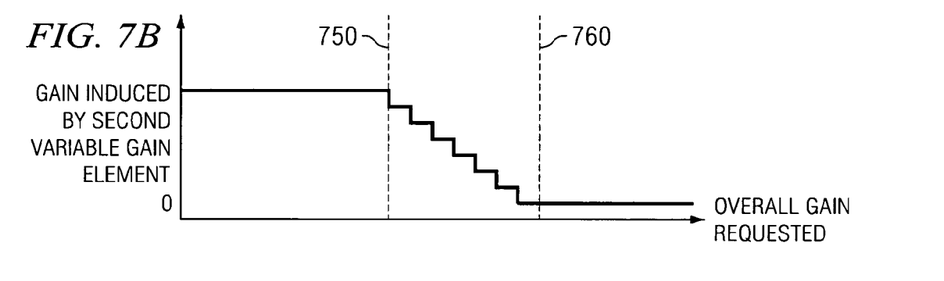
Figure 7C:
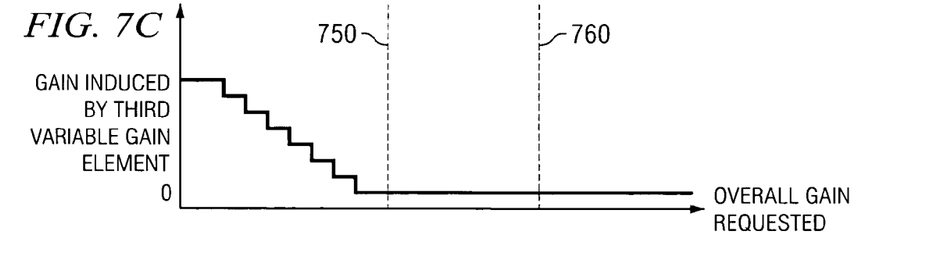
Figure 7D:
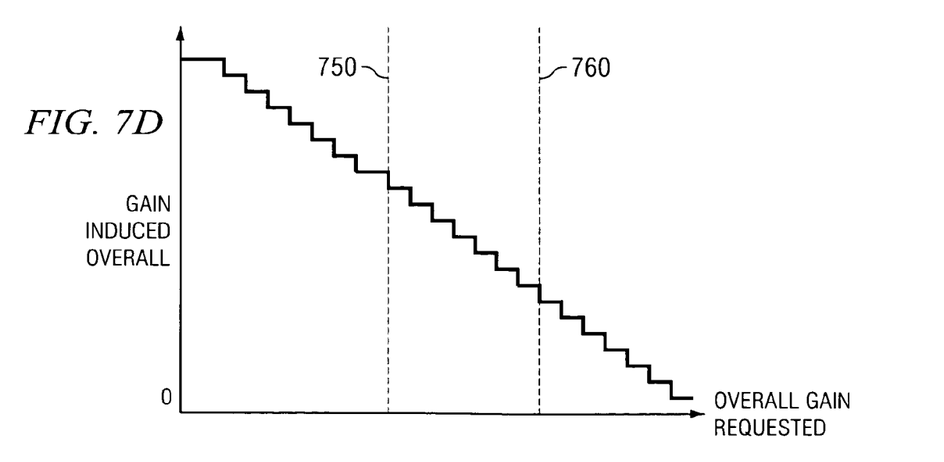

FIGS. 7A-7D are diagrams illustrating examples of the operation of a plurality of filter modules incorporated in a particular embodiment of the filter stage as the filter stage reduces the gain induced in a received signal. As noted above, filter stage 40 includes any appropriate number of variable gain elements 220 that may be controlled using any number of appropriate decoded control bits 212. The embodiment of filter stage 40 described by FIGS. 7A-7D includes three variable gain elements 220, each receiving three decoded control bits 212. As a result, each variable gain element 220 is capable of inducing any of eight different levels of gain in signals received by variable gain elements 220. In particular, FIGS. 7A, 7B, and 7C illustrate the gain induced by variable gain elements 220a, 220b, and 220c, respectively, while FIG. 7D illustrates the overall gain induced by filter module 40. More specifically, FIGS. 7A-7D illustrate the gain induced by the relevant component as the overall gain induced by filter module 40 is reduced.

As shown by FIGS. 7A-7C, filter module 40 increases its overall gain by first reducing the gain induced by variable gain element 220c. Once variable gain element 220c is configured so that variable gain element 220c induces a gain equal to a minimum gain associated with variable gain element 220c (a point marked in FIGS. 7A-7D by line 750) filter module 40 continues to reduce the overall gain by reducing the gain induced by variable gain element 220b. Once variable gain element 220b is configured so that variable gain element 220b induces a gain equal to a minimum gain associated with variable gain element 220b (a point marked in FIGS. 7A-7D by line 760) filter module 40 continues to reduce the overall gain by reducing the gain induced by variable gain element 220a. Thus, filter module 40 is able to reduce the overall gain induced by filer module 40 by gradually reducing the gain induced by the various variable gain elements 220 of filter module 40, starting with the last variable gain element 220 in the signal path traversed by received signals.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A system for filtering a signal, comprising:
a plurality of filter modules coupled in series, wherein each filter module comprises:
a filter operable to:
receive an input signal;
attenuate a portion of the input signal that is outside a passband associated with the filter; and
output at least a portion of the input signal that is within the passband associated with the filter; and
a variable gain element operable to:
receive a control signal; and
induce a gain in an output of the filter based on the control signal.

2. The system of claim 1, wherein the plurality of filter modules comprise three filter modules.

3. The system of claim 1, further comprising a filter interface operable to:
generate a control signal comprising a plurality of control bits; and
transmit one or more control bits to each of the variable gain elements in the plurality of filter modules, and wherein each of the variable gain elements is operable to induce a gain in the output of a filter associated with that variable gain element based on the one or more control bits received by that variable gain element.

4. The system of claim 3, wherein the filter interface comprises:
an analog-to-digital converter operable to receive an analog control signal and generate a digital control signal based on the analog control signal; and
a decoder operable to receive the digital control signal and to generate the one or more plurality of bits based on the control digital control signal.

5. The system of claim 3, wherein the filter interface is operable to reduce an overall gain induced by the plurality of filter modules by:

reducing a gain induced by a last filter module along a signal path through the plurality of filter modules to a minimum gain associated with the last filter module; and reducing a gain induced by one or more other filter modules in the plurality of filter modules.

6. The system of claim 3, wherein the filter interface is operable to increase an overall gain induced by the plurality of filter modules by:

increasing a gain induced by a last filter module along a signal path through the plurality of filter modules to a maximum gain associated with the last filter module; and increasing a gain induced by one or more other filter modules in the plurality of filter modules.

7. The system of claim 1, wherein each of the variable gain elements comprises an operational amplifier and a plurality of feedback paths, wherein each of the feedback paths comprises:

a resistive element; and a switch operable to:

receive one or more of the control bits; and selectively couple an output of the operational amplifier to an input of the operational amplifier through the resistive element in that feedback path based on the one or more control bits.

8. The system of claim 7, wherein the resistive element comprises a resistor.

9. The system of claim 7, wherein the resistive element comprises a transistor.

10. A method for filtering an input signal, comprising:

receiving an input signal at a first filter module in a plurality of filter modules coupled in series, each filter module comprising a filter and a variable gain element;

attenuating, at a first filter in the first filter module, a portion of an input signal that is outside a passband associated with the first filter;

inducing, at a first variable gain element in the first filter module, a first gain in an output of the first filter based on a first control signal received by the first variable gain element;

attenuating, at a second filter in a second filter module, a portion of a signal output by the first variable gain element, wherein the portion attenuated by the second filter comprises a portion of the signal that is outside a passband associated with the second filter; and inducing, at a second variable gain element in the second filter module, a second variable gain in an output signal of the second filter.

11. The method of claim 10, further comprising:

generating a control signal comprising a plurality of control bits; and transmitting one or more control bits to each of the first variable gain element, the second variable gain element, and the third variable gain element, and wherein the first variable gain element, the second variable gain element, and the third variable gain element are each operable to induce a gain in signals received by that variable gain element based on the one or more control bits received by that variable gain element.

12. The method of claim 11, further comprising:

receiving an analog control signal;

generating a digital control signal based on the analog control signal; and decoding the digital control signal into the one or more control bits.

13. The method of claim 10, further comprising:

receiving, at an input of a third filter module, a signal output by the second variable gain element, wherein the third filter module comprises a third filter and a third variable gain element;

attenuating, at the third filter, a portion of the signal output by the second variable gain element, wherein the portion attenuated by the third filter comprises a portion of the signal that is outside a passband associated with the third filter; and inducing, at the third variable gain element, a third variable gain in an output signal of the third filter.

14. The method of claim 10, further comprising reducing, by a gain difference, a total gain induced in the input signal by:

reducing, by a first portion of the gain difference, the third gain induced by the third variable gain element;

after reducing the third gain, reducing, by a second portion of the gain difference, the second gain induced by the second variable gain element; and after reducing the second gain, reducing, by a third portion of the gain difference, the first gain induced by the first variable gain element.

15. The method of claim 10, further comprising increasing, by a gain difference, a total gain induced in the input signal by:

increasing, by a first portion of the gain difference, the third gain induced by the third variable gain element;

after increasing the third gain, increasing, by a second portion of the gain difference, the second gain induced by the second variable gain element; and after increasing the second gain, increasing, by a third portion of the gain difference, the first gain induced by the first variable gain element.

16. A system for filtering an input signal, comprising:

means for receiving an input signal at a first filter module in a plurality of filter modules coupled in series, each filter module comprising attenuating means and inducing means;

first attenuating means for attenuating a portion of an input signal that is outside a passband associated with the first attenuating means;

first inducing means for inducing a first gain in an output of the first attenuating means based on a first control signal received by the first inducing means;

second attenuating means for attenuating a portion of a signal output by the first inducing means, wherein the portion attenuated by the second attenuating means comprises a portion of the signal that is outside a passband associated with the second attenuating means; and second inducing means for inducing a second variable gain in an output signal of the second attenuating means.

17. The system of claim 16, further comprising:

means for generating a control signal comprising a plurality of control bits; and means for transmitting one or more control bits to each of the first inducing means, the second inducing means, and the third inducing means, and wherein the first inducing means, the second inducing means, and the third inducing means are each operable to induce a gain in signals received by that inducing means based on the one or more control bits received by that inducing means.

18. The system of claim 17, further comprising:

means for receiving an analog control signal;

means for generating a digital control signal based on the analog control signal; and means for decoding the digital control signal into the one or more control bits.

19. The system of claim 16, further comprising:

means for receiving, at an input of a third filter module, a signal output by the second inducing means, wherein the third filter module comprises third attenuating means and third inducing means;

third attenuating means for attenuating a portion of the signal output by the second inducing means, wherein the portion attenuated by the third attenuating means comprises a portion of the signal that is outside a passband associated with the third attenuating means; and third inducing means for inducing a third variable gain in an output signal of the third attenuating means.

20. The system of claim 16, further comprising means for reducing, by a gain difference, a total gain induced in the input signal, wherein the means for reducing the total gain comprise:

first reducing means for reducing, by a first portion of the gain difference, the third gain induced by the third inducing means;

second reducing means for reducing, by a second portion of the gain difference, the second gain induced by the second inducing means; and third reducing means for reducing, by a third portion of the gain difference, the first gain induced by the first variable gain element.

21. The system of claim 16, further comprising means for increasing, by a gain difference, a total gain induced in the input signal, wherein the means for increasing the total gain comprise:

first increasing means for increasing, by a first portion of the gain difference, the third gain induced by the third variable gain element;

second increasing means for increasing, by a second portion of the gain difference, the second gain induced by the second variable gain element; and third increasing means for increasing, by a third portion of the gain difference, the first gain induced by the first variable gain element.

* * * * *